(12) United States Patent
Karl et al.

(10) Patent No.: US 11,509,118 B2
(45) Date of Patent: Nov. 22, 2022

(54) LASER DEVICE

(71) Applicant: University Court of the University of St Andrews, St Andrews (GB)

(72) Inventors: Markus Karl, Elfershausen (DE); Malte C. Gather, Fife (GB); Ifor David William Samuel, St Andrews (GB); Graham A. Turnbull, St Andrews (GB)

(73) Assignee: University Court of the University of St Andrews, St Andrews (GB)

( * ) Notice: Subject to any disclaimer, the term of this patent is extended or adjusted under 35 U.S.C. 154(b) by 146 days.

(21) Appl. No.: 16/629,891

(22) PCT Filed: Jul. 4, 2018

(86) PCT No.: PCT/GB2018/051873
§ 371 (c)(1),
(2) Date: Jan. 9, 2020

(87) PCT Pub. No.: WO2019/012249
PCT Pub. Date: Jan. 17, 2019

(65) Prior Publication Data
US 2021/0143613 A1    May 13, 2021

(30) Foreign Application Priority Data
Jul. 10, 2017  (GB) ..................... 1711097

(51) Int. Cl.
*G06K 7/10* (2006.01)
*H01S 5/36* (2006.01)
(Continued)

(52) U.S. Cl.
CPC .............. *H01S 5/36* (2013.01); *B42D 25/328* (2014.10); *B42D 25/36* (2014.10); *B42D 25/45* (2014.10);
(Continued)

(58) Field of Classification Search
CPC ........ H01S 5/36; H01S 5/041; H01S 5/18361; B42D 25/328; B42D 25/36; B42D 25/45; G06K 7/10564; G06K 7/12; G06K 7/1413
(Continued)

(56) References Cited

U.S. PATENT DOCUMENTS 7,537,170 B2    5/2009 Reed et al.
2010/0091268 A1    4/2010 Power et al.
(Continued)

FOREIGN PATENT DOCUMENTS

CN    101388523 A    3/2009
EP    1222616 A1    7/2002
(Continued)

OTHER PUBLICATIONS

International Search Report and Written Opinion for PCT Patent Application No. PCT/GB2018/051873, dated Sep. 14, 2018.
(Continued)

*Primary Examiner* — Daniel A Hess
(74) *Attorney, Agent, or Firm* — Locke Lord LLP; Christopher J. Capelli

(57) ABSTRACT

A security or identification device comprises a membrane laser structure configured to be optically pumped. The membrane laser structure comprises a flexible emission layer comprising a gain material; and one or more structures formed in or associated with the flexible emission layer and configured to provide optical feedback in the emission layer to produce a laser light output having at least one property representing an identifier.

31 Claims, 12 Drawing Sheets

(51) Int. Cl.

| | | |
|---|---|---|
| *B42D 25/328* | (2014.01) | |
| *B42D 25/36* | (2014.01) | |
| *B42D 25/45* | (2014.01) | |
| *G06K 7/12* | (2006.01) | |
| *G06K 7/14* | (2006.01) | |
| *H01S 5/04* | (2006.01) | |
| *H01S 5/183* | (2006.01) | |
| *B42D 25/21* | (2014.01) | |
| *B42D 25/29* | (2014.01) | |
| *G07D 7/1205* | (2016.01) | |
| *G07D 7/202* | (2016.01) | |

(52) U.S. Cl.
CPC ........... *G06K 7/10564* (2013.01); *G06K 7/12* (2013.01); *G06K 7/1413* (2013.01); *H01S 5/041* (2013.01); *H01S 5/18361* (2013.01); *B42D 25/21* (2014.10); *B42D 25/29* (2014.10); *G07D 7/1205* (2017.05); *G07D 7/205* (2013.01); *G07D 2207/00* (2013.01)

(58) Field of Classification Search
USPC .......................................................... 356/71
See application file for complete search history.

(56) References Cited

U.S. PATENT DOCUMENTS

| | | |
|---|---|---|
| 2011/0170570 A1 | 7/2011 | Singer et al. |
| 2017/0059775 A1 | 3/2017 | Coles et al. |
| 2017/0149210 A1* | 5/2017 | Zhai ........................ H01S 3/168 |

FOREIGN PATENT DOCUMENTS

| | | |
|---|---|---|
| EP | 1411606 A2 | 4/2004 |
| WO | WO-2016154668 A1 | 10/2016 |

OTHER PUBLICATIONS

Zhai, Tianrui, et al. "Free-standing membrane polymer laser on the end of an optical fiber." Applied Physics Letters 108.4 (2016): 041904.

Hermsdorf, Johannes, et al. "Flexible blue-emitting encapsulated organic semiconductor DFB laser." Optics express 18.25 (2010): 25535-25545.

Foucher, C., et al. "Diode-pumped, mechanically-flexible polymer DFB laser encapsulated by glass membranes." Optics express 22.20 (2014): 24160-24168.

Chen, Yujie, et al. "Laser action in a surface-structured free-standing membrane based on a -conjugated polymer-composite." Organic Electronics 12.1 (2011): 62-69.

Foucher, C., et al. "RGB and white-emitting organic lasers on flexible glass." Optics express 24.3 (2016): 2273-2280.

Guilhabert, B., et al. "Mechanically flexible organic semiconductor laser array." IEEE Photonics Journal 4.3 (2012): 684-690.

Kim, Sejeong, et al. "Semiconductor Photonic Nanocavity on a Paper Substrate." Advanced Materials 28.44 (2016): 9765-9769.

Kaltenbrunner, Martin, et al. "An ultra-lightweight design for imperceptible plastic electronics." Nature 499.7459 (2013): 458-463.

Zschieschang, Ute, et al. "Organic electronics on banknotes." Advanced Materials 23.5 (2011): 654-658.

Wang et al. "LED pumped polymer laser sensor for explosives", Laser Photonics Review 7, No. 6, L71-L76, 2013.

Rose at al. "Sensitivity gains in chemosensing by lasing action in organic polymers", Nature, vol. 434, Apr. 14, 2005.

* cited by examiner

C

LASER DEVICE

CROSS REFERENCE TO RELATED APPLICATIONS

This application is the U.S. National Stage of PCT International Application No. PCT/US2018/051873, filed Jul. 4, 2018, the entire disclosure of which is hereby incorporated herein by reference in its entirety.

INTRODUCTION

The present invention relates to a laser device, for example a security, identification or sensing device comprising a membrane laser structure.

BACKGROUND

A driving force in organic semiconductor research is the desire to fabricate low-cost, lightweight and mechanically flexible devices. Membrane lasers based on organic semiconductors have been considered for the above purposes, however, they are considered difficult to make and also fragile. The applications for using membrane lasers and organic lasers have therefore been limited.

SUMMARY

In a first aspect of the invention, a security or identification device comprising a membrane laser structure configured to be optically pumped, the membrane laser structure comprising:
   a flexible emission layer comprising a gain material; and
      one or more structures formed in or associated with the flexible emission layer and configured to provide optical feedback in the emission layer to produce a laser light output having at least one property representing an identifier.

The emission layer may be configured to receive light from a light source. The light source may comprise an optical pump source. The source may comprise a source of coherent light or a source of incoherent light. The source may comprise a laser or an LED. The light may comprise visible light and/or may comprise at least one of infra-red or ultraviolet light.

The membrane laser may have a propagation direction along which the light propagates to produce the laser light output, and optionally at least some of the material of the emission layer may be interspersed along the propagation direction.

The one or more structures may comprise resonant structures.

The one or more structures may comprise at least one periodic structure, wherein at least one period of the at least one periodic structure is such as to provide said at least one property of the laser light output.

The one or more structures may comprise one or more grating structures. The grating structures may be formed from the gain material. Alternatively, the grating structures may form part of a separate grating layer. The one or more structures may comprise a surface corrugation at an emission layer interface.

The gain material may have a periodic structure. The periodic structure of the gain material may comprise changes in one or more properties of the gain material. The one or more properties may comprise refractive index, absorption or gain or amplification. The gain material and the one or more grating structures may have complementary structures.

At least one of the one or more grating structures may be oriented relative to another grating structure of the one or more grating structures.

The grating structures may be gratings.

The one or more structures of the emission layer may be at least one of contiguous, overlapping or side-by-side.

The at least one property may comprise at least one wavelength.

The at least one property may alternatively or in addition comprise at least one of: polarization state, far-field or near-field pattern.

The at least one property may comprise one or more wavelengths in a selected wavelength range, for example between about 380 and 900 nm, optionally between about 440 nm and 660 nm.

The identifier may be representative of the identity of the security device or at least one property of the security device, or the identity or at least one property of an object to which the security device is attached or to be attached, or the identity or at least one property of an owner, user, manufacturer or retailer of the device or object, or the identity or at least one property of content stored by the object or contained in the object.

The one or more structures may be such as to be representative of the identifier by producing a laser light output having at least one property representing said identifier when illuminated said optical pumping is performed, for example when light of predetermined wavelength and/or other property is provided to the one or more structures by said optical pumping.

The security device may be attached to a banknote or is configured to be attached to a banknote, and the identifier is representative of or associated with at least one of the manufacturer of the banknote or a serial number of the banknote.

The security device may be attached to an object or is configured to be attached to an object, and optionally the object comprises at least one of: a wearable tag, an identification card, a passport, packaging, a contact lens, a body part, a medicament or a medicament container, a pharmaceutical product, a storage device for example a video, audio or computer program storage device, a watch, an item of jewelry, a food or drink container, an electronic device or component, an optical device or component.

The at least one property may be representative of or associated with at least one biometric property.

The membrane laser structure may comprise a distributed feedback laser (DFB) structure.

The gain material may have a thickness of at least 10 nm, optionally in the range 50 nm to 300 nm.

The one or more structures may comprise one or more gratings comprising a groove depth of 30 to 120 nm.

The membrane laser may comprise a length in the range 10 μm to 25 mm and a width in the range 10 μm to 25 mm.

The emission layer may comprise one or more further gain materials.

The one or more further gain materials may be provided separately from the gain material. The one or more further gain materials may be blended with the gain material.

The gain layer may comprise a polymer, for example a conjugated polymer.

The polymer may comprise one of:
F80.9BT0.1;
F8BT; and
Super Yellow.

F80.9BT0.1 refers to poly(9,9-dioctylfluorene-co-benzo-thiadiazole) with a 9:1 ratio of F8- and BT units); F8BT refers to (poly(9,9-dioctylfluorene-co-benzothiadiazole)); and Super Yellow refers to ((poly[{2,5-di(3,7-dimethyloctyloxy)-1,4-phenylenevinylene-co-{3-(4'-(3',7''-dimethyloctyloxy)phenyl)-1,4-phenylenevinylene}-co-{3-(3'-(3',7-dimethyloctyloxy)phenyl)-1,4-phenylenevinylene}])).

The gain material may comprise at least one of an organic semiconductor, semiconductor quantum dot nanoparticles, organic dye molecules and a fluorescent protein.

The one or more structures may be formed from a photo-resist, for example, a UV curable photo-resist.

In a further aspect of the present invention, which may be provided independently, there is provided a method of marking or identifying a device comprising:
  obtaining a membrane laser structure configured to be optically pumped, the membrane laser structure comprising:
    a flexible emission layer comprising a gain material; and one or more scattering structures formed in or associated with the flexible emission layer and configured to provide optical feedback in the emission layer to produce a laser light output having at least one property; and
  attaching the membrane laser structure to an object.

Attaching the membrane laser structure may comprise attaching the membrane laser structure to the object following production of the object.

The method may further comprise applying a protective layer on the membrane laser structure.

The method may further comprise:
  forming a sacrificial layer on a substrate;
  providing at least one membrane laser structure on the sacrificial layer, wherein the membrane laser structure comprises a flexible emission layer;
  forming one or more structures in or associated with the flexible emission layer;
  dissolving and/or detaching the sacrificial layer thereby separating the membrane laser structure from the substrate.

The sacrificial layer may be water soluble.

The method may further comprise printing the structures. Printing may comprise using a UV nanoimprint lithography process.

The method may further comprise separating the membrane laser structure into a plurality of separate membrane laser structures.

The sacrificial layer may comprise at least one of:
PEDOT, PEDOT:PSS, polyethylene glycol, polyacrylamide, poly(acrylic acid), Dextran, poly(methacrylic acid), poly(ethylene imine).

In a further aspect of the invention, which may be provided independently, there is provided a method of determining an identifier comprising applying light to a device according to the first aspect of the invention to produce a laser light output having at least one property representing the identifier and determining the identifier from the laser light output.

In a further aspect of the invention, which may be provided independently, there is provided a sensor comprising a membrane laser structure for performing a sensing process for sensing at least one substance in at least one sensing region, wherein the membrane laser structure comprises at least two opposed sensing surfaces arranged such that each of which is exposed to said at least one sensing region.

The sensor may comprise a flexible emission layer comprising a gain material; and one or more structures formed in or associated with the flexible emission layer and configured to provide optical feedback in the emission layer to produce a laser light output representative of the at least one sensed substance The at least one of the at least two opposed sensing surfaces is in contact with the at least one sensing region.

The at least one sensing region comprises part of a surrounding environment.

The sensor may further comprise a light emitting conjugated polymer.

The at least one substance may comprise a chemical vapour, for example, DNT, TNT, traces of amines, oxygen.

BRIEF DESCRIPTION OF THE DRAWINGS

Various aspects of the invention will now be described by way of example only, and with reference to the accompanying drawings, of which.

DETAILED DESCRIPTION OF THE DRAWINGS

Figure 1:
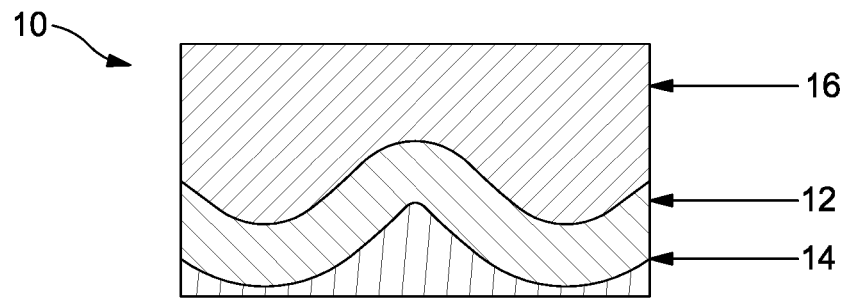
FIG. 1 is a schematic diagram of a membrane laser structure.

According to at least some embodiments, an architecture for an organic laser comprising an ultrathin (less than 500 nm) substrate-less membrane-based device with ultralow-weight (m/A less than 0.5 gm$^{-2}$) and extreme mechanical flexibility is presented.

The above properties may be achieved in certain embodiments via a water-soluble sacrificial layer or lift-off layer that facilitates floating a distributed feedback (DFB) laser membrane off a sacrificial substrate. The lasers can then be operated as free-standing membranes or be transferred onto another substrate. The other substrate may be provided by another object, for example, wearable tags, banknotes, identity cards, passports, packaging, contact lenses, body parts. The unique lasing spectrum can be readily read out and used as a security feature. Advantageously, the threshold of the membrane laser is well below the safety limit for the human eye, hence membrane lasers on contact lenses can become wearable security tags.

Optically pumped organic solid-state lasers gained widespread attention as coherent light sources that are easy to fabricate, emission tunable across the whole visible range and potentially disposable and biocompatible. Consequently, these lasers have potential for various applications such as on-chip spectroscopy, data-communication, biosensing and chemosensing for detecting explosives.

Organic lasers based on distributed feedback (DFB) resonators can show excellent thin film incorporation and according to embodiments may provide flexible laser devices providing strong in-plane optical feedback. The flexibility and thickness of an organic semiconductor device is inherently limited by the substrate (with a thickness typically greater than 100 μm). According to embodiments, releasing the fabricated device from the substrate it is built on may achieve mechanical flexibility with a thickness in the 100 nm range and may provide transferability. Furthermore, the single mode lasing emission can be tuned by modifying the grating period, the choice of gain material and the waveguide design. Combining several grating resonators with different periods, allows customization of a well-defined and unique output spectrum inherent to the laser source according to certain embodiments.

According to certain embodiments, waveguide design can be controlled by varying several parameters. These include thickness of layers in the structure, the material used in, and therefore the refractive index of, each layer and the number of layers. Controlling these parameters allows a more complex laser output to be formed compared to a simple surface grating, thus offering additional security benefits. The wavelength of the laser depends on the product of the grating period and the effective refractive index of the grating. Changes to the indices of any of the layers in the structure and/or their thickness therefore impacts the wavelength of the laser output of the membrane.

As described with reference to FIG. 5, it is possible to use the unique lasing spectrum of a thin and flexible organic DFB membrane laser directly as a counterfeit resilient barcode-type label which can be applied to various objects for authentication control.

The membrane laser structure is suitable for use for a whole range of applications such as wearable security, barcoding for identification, vapour sensing, anti-counterfeiting of objects, for example perfume, spirits, banknotes.

FIG. 1 shows a membrane laser 10 of a security device. The membrane laser 10 has a gain layer 12 and a grating layer 14. Also shown in FIG. 1 is air 16 of the surrounding environment of the membrane laser 10. The air 16 is above the membrane laser 10. The gain layer 12 comprises a gain material.

The upper surface of the membrane laser 10, for example, the upper surface of the gain layer 12, is exposed to the environment above the membrane laser 10. The lower surface of the membrane laser 10, for example the lower surface of the grating layer 14, is exposed to the environment below the membrane laser 10.

The membrane laser 10 is configured to be optically pumped by an optical source (not pictured). Light is input from the optical source to the membrane laser 10. Stimulated emission in the gain layer 12 produces light in the gain layer 12. The grating layer 14 has one or more grating structures configured to diffract and reflect light in the gain layer 12 to produce a laser light output. The laser light output has at least one property that represents an identifier. The at least one property that represents an identifier may be referred to as a signature property.

The at least one property may comprise at least one of: polarization state, far-field pattern, near-field pattern or wavelength. In some embodiments, the at least one property comprises two or more wavelengths.

In further detail, the grating layer 14 comprises one or more grating structures configured to scatter guided modes of particular wavelength for coherent combination within the gain layer 12 and thus provide optical feedback required for stimulated emission and lasing light which is diffracted to produce a laser output having at least one property representing an identifier. The grating structures thereby act as resonant structures.

In use, the membrane laser 10 forms part of a security device and may be attached to a further object and the identifier is representative of the identity or at least one property of an object to which the security device is attached. Attachment may include any suitable type of attaching, including adhering and depositing.

The identifier may alternatively, or in addition, be representative of the identity of the security device or at least one property of the security device.

The grating layer 14 has one or more grating structures that comprise one or more periodic structures. The period of each of the periodic structures is such as to provide a signature wavelength of laser light output. A grating layer 14 with a plurality of period structures with different periods will produce laser light output having a plurality of signature wavelengths corresponding to each of the periods.

The grating structures may be provided in any suitable arrangement, for example they may be provided contiguously, overlapping or side-by-side.

In some embodiments, one or more grating structures may be oriented relative to each other. The one or more grating structures may comprise one-dimensional grooves, two-dimensional patterns. The one or more grating structures may exhibit 2-fold, 3-fold or higher-fold symmetry.

The gain layer and grating layer may have complementary structures. As shown in FIG. 1, the shape of the gain layer complements the shape of the grating layer.

According to simulations the first transversal electric mode ($TE_0$) would be supported by a gain layer having a thickness of 10 nm. Membranes with a thickness of 300 nm have been demonstrated, however, membranes with thicknesses greater than 300 nm may also be provided. The gain layer 12 may have a thickness in the range 10 nm to 300 nm. The grating layer 14 may have gratings with a groove depth in the range of 30 nm to 120 nm.

In FIG. 1, the membrane laser 10 is shown as having a gain layer 12 and a separate grating layer 14. In other embodiments, a single flexible emission layer is provided, the flexible emission layer being made of a gain material having structures. The structures may be periodic structures. For example, the gain material may have a periodic structure. The periodic structure of the gain material may comprise changes in one or more properties of the gain material including refractive index, absorption or gain or amplification. The periodic structures may be a grating structures formed directly in the gain material. In these embodiments, the emission layer operates substantially in line with the gain layer 12 and grating layer 14 and the structures of the emission layer substantially correspond to the grating structures of the grating layer 14.

Figure 2:
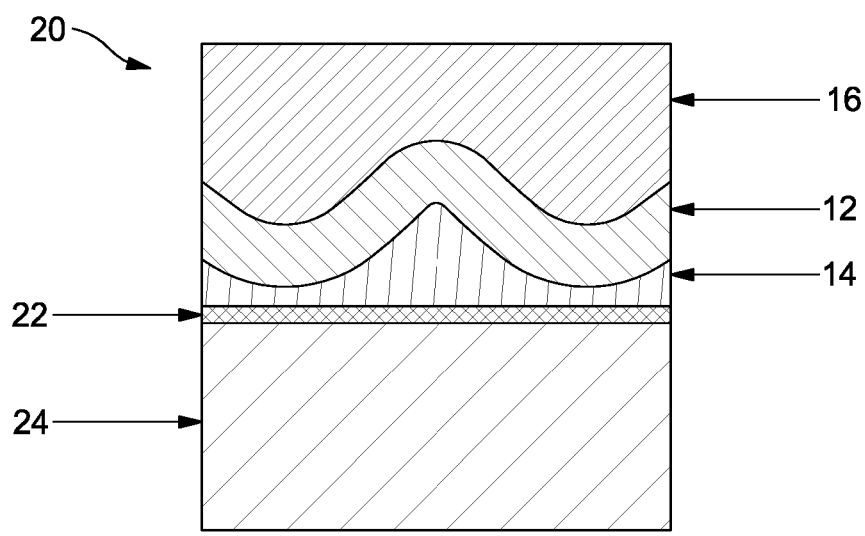
FIG. 2 is a schematic diagram of a membrane laser stack.

FIG. 2 shows a membrane laser stack 20 used during manufacturing of the membrane laser 10. The membrane laser stack 20 also has the gain layer 12 and the grating layer 14 of the membrane laser 10 shown in FIG. 1. The membrane laser stack 20 also has a sacrificial layer 22 and a substrate 24. The membrane laser stack 20 is described in further detail with reference to FIG. 3(*b*).

Figure 3:
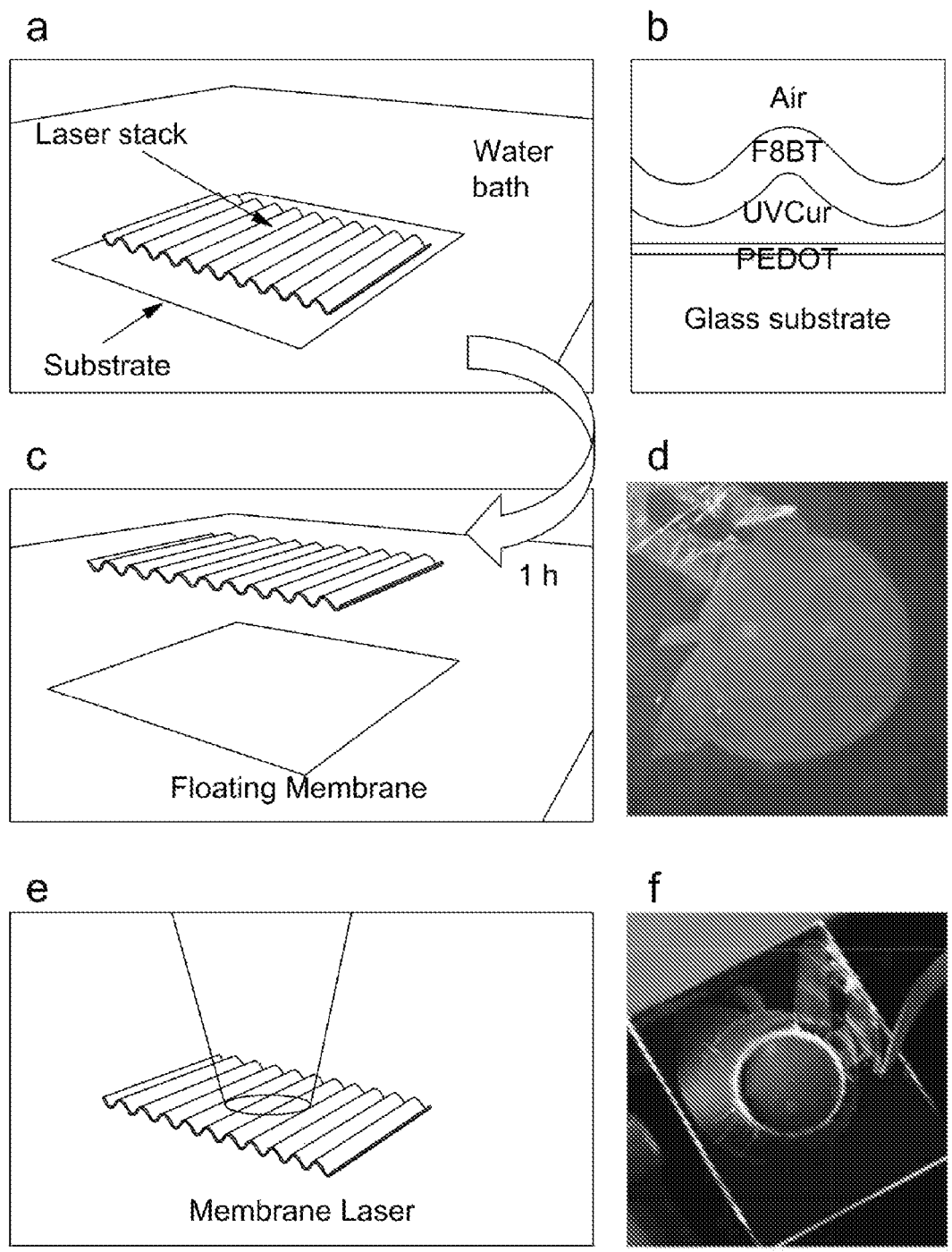
FIG. 3 shows fabrication and physical properties of the membrane laser structure.
Figure 3:
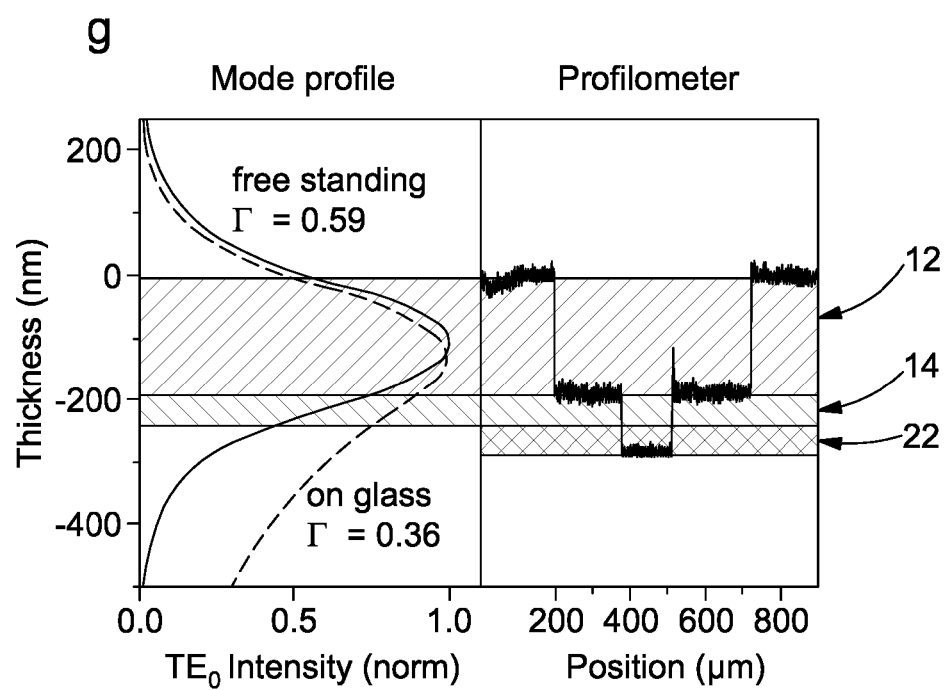

FIG. 3 is a collection of Figures illustrating schematics, fabrication and physical properties of the membrane laser structure.

To fabricate transferable and thin membrane lasers, a water-based lift-off technique is used. This is illustrated in FIG. 3(*a*) which shows a perspective view of the laser stack 20 immersed in water in a water bath. The sacrificial layer 22 is made out of poly(3,4-ethylenedioxythiophene)-polystyrene-sulfonate, referred to as PEDOT:PSS. The laser stack 20 may be produced via UV nanoimprint lithography and spin coating. Further details of the production of the laser stack 20 are included below.

FIG. 3(b) shows the composition of the laser stack of FIG. 2 before lift-off. The substrate 24 of the laser stack 20 is a thick and rigid glass substrate. For example, the glass has a thickness of at least 100 μm, typically in the range 0.5 to 2 mm. Enabling lift-off of the membrane laser is the sacrificial layer 22 which is a water soluble sacrificial layer. The sacrificial layer is made of PEDOT:PSS and is approximately 50 nm thin. The grating layer 14 comprises a UV curable periodic grating structure (UVCur21). The gain layer 12 is a thin layer (180±10 nm) of gain material. Any suitable polymer may be used as gain material. In this example, the gain material is $F8_{0.9}BT_{0.1}$ copolymer (polyfluorene derivate with a 9:1 ratio of F8- and BT-units).

Alternatively, the sacrificial layer may be made of any suitable material, for example, PEDOT, PEDOT:PSS, polyethylene glycol, polyacrylamide, poly(acrylic acid), Dextran, poly(methacrylic acid), poly(ethylene imine).

FIG. 3(c) is a perspective view of the laser stack post lift-off and FIG. 3(d) is an image of the membrane post lift-off while floating. FIG. 3(c) and FIG. 3(d) shows the membrane spreading and floating on the water surface. Post lift-off, the hydrophobic membrane has a mass to area ratio (m/A) of approximately 0.5 gm$^{-2}$. Consequently, the membrane laser can be operated as a free-standing membrane which is suspended over a 1 cm hole in a glass cover slide or transferred onto the desired substrate. FIG. 3(e) is a perspective view of vertical laser emission from a second-order DFB laser membrane. The pump spot of the laser is not shown. FIG. 3(f) is an image of a free-standing membrane laser suspended over a hole in a glass substrate.

Using the above described lift-off technique, membrane lasers based on one-dimensional second-order and mixed-order DFB gratings with different periodicities and gain materials were manufactured.

FIG. 3(g) is two plots showing two measurements over the thickness of membrane lasers. In these plots, properties of a membrane laser (after lift-off) and a membrane laser stack (before lift-off) are shown. The upper (yellow) band corresponds to the gain layer, the middle (light grey) band corresponds to the grating layer and the hatched band corresponds to the sacrificial layer. The left hand side of FIG. 3(g) shows a simulation of the intensity (norm) of the first supported transversal electric ($TE_0$) mode for a free-standing membrane laser (solid line) and a laser on a glass substrate (dashed line) against thickness (nm) of the membrane laser. The right hand side of FIG. 3(g) shows a profilometer measurement of the membrane before lift-off.

The lift-off technique described herein diminishes the need for a rigid substrate, for example, glass with a refractive index of 1.52, and therefore improves the wave-guiding properties which leads to reduced leaky substrate modes and a higher mode confinement in the gain material (which has a refractive index n=1.7). The overlap factor Γ representing the mode overlap with the gain material improves from Γ=0.36 for a free-standing membrane laser on a glass substrate to Γ=0.59 for the free-standing membrane laser.

Figure 4:
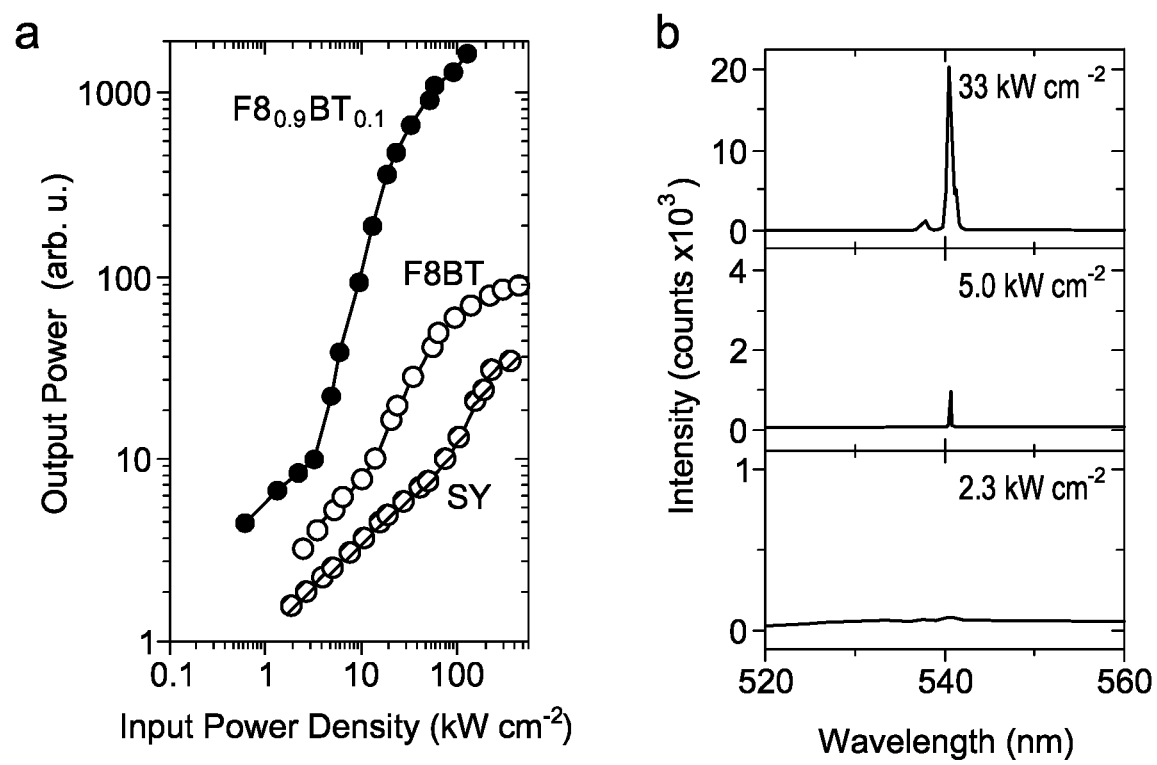
FIG. 4 shows characterization of different membrane lasers.
Figure 4:
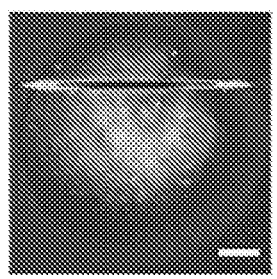
Figure 4:
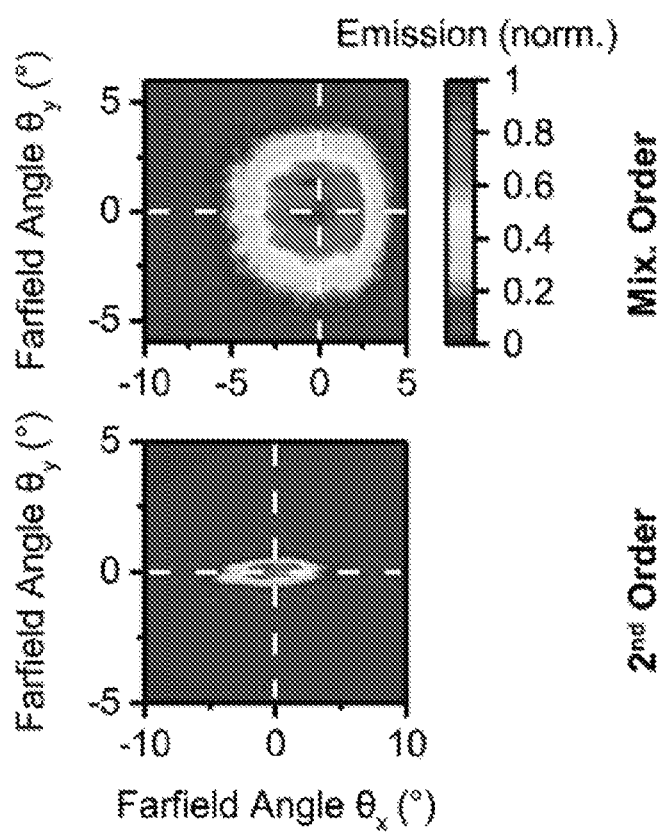

FIGS. 4(a) to 4(c) are a collection of figures that show characterization of membrane lasers. FIG. 4(a) shows input-output characteristics for mixed-order membrane lasers with different gain materials. As described above, different gain materials can be used for the gain layer. Here three different gain materials are demonstrated: $F8_{0.9}BT_{0.1}$, F8BT and Super Yellow.

Whilst only one gain material is implemented in each device, more than one gain material may be used. More than one gain material provided separately in the gain layer may give a broader range of laser wavelengths. This is discussed in further detail with reference to FIG. 5. Alternatively, the gain layer be formed by more than one gain materials blended together. For example, a first gain material having a first bandgap and a second gain material having a second bandgap may be blended to exploit a non-radiative energy transfer from the wider bandgap material to the narrower bandgap material. Pump light may then be absorbed in one material, the wider bandgap material, and the excitations pass to the narrow gap material to emit. Advantageously, the emission wavelengths may be shifted further from the strongly absorbing wavelengths and thereby the pump power threshold of the laser may be reduced.

The lasing threshold for $F8_{0.9}BT_{0.1}$, F8BT and Super Yellow based devices are 3.3 kW cm$^{-2}$, 13.8 kW cm$^{-2}$ and 75.6 kW cm$^{-2}$, respectively. Devices based on mixed-order gratings and $F8_{0.9}BT_{0.1}$ as the gain material showed lasing emission upon pulsed excitation (using a pump beam with wavelength of λ=450 nm, pulse length 5 ns and repetition frequency of 5 Hz) with a threshold pump fluence as low as 3.3 kW cm$^{-2}$ as shown in FIG. 4(a), in line with state of the art organic DFB lasers.

Pump beams of different wavelengths may be used, and the parameters of the laser may vary. In particular the parameters of the laser may be selected depending on the gain material used.

FIG. 4(b) shows single mode emission spectra of the $F8_{0.9}BT_{0.1}$ based membrane laser (mixed-order DFB grating). The spectra are shown for pump fluences below, at and above the lasing threshold. At low pump fluences the spectrum is dominated by the fluorescence background with a broad Bragg mode at a wavelength approximately 540 nm. Above threshold a lasing mode appeared and gained super linearly in relative intensity, eventually completely dominating the emission spectrum.

FIG. 4(c) shows near and far field emission of mixed-order and second-order DFB grating membrane lasers. The scale bars are 20 μm. The near field emission of the mixed-order grating indicates that the emission is mainly collected from the second-order region whereas feedback is provided in the first order region. Due to the narrow width of the second-order region, the far field emission is rather broad (±5°) and can be tailored with the number of second-order periods used to couple out the light. For second-order DFB membrane gratings the light output is enhanced (threshold consistently higher) as can be seen in the near field emission pattern and the far field emission is well defined (±0.5°) and of double-lobe nature. The well-defined far field emission is a clear indication for spatial coherence and further evidence for laser action.

In some embodiments far-field patterns and/or near-field patterns of output laser light may be used as a signature property of the output laser light.

As discussed above, the membrane manufacturing process is compatible with a range of conjugated polymers of different chemical structure and molecular weight. $F8_{0.9}BT_{0.1}$, F8BT and Super Yellow (SY) were tested and it was found that $F8_{0.9}BT_{0.1}$ provides the best laser performance (lowest threshold), in line with earlier findings on rigid substrates.

An important feature of the membrane lasers according to certain embodiments is their transferability and mechanical flexibility. Post lift-off, the membranes can be transferred onto any surface or substrate substantially regardless of the morphology and topology of the surface or substrate. After water evaporation, for example at room temperature, the membrane sticks tightly to the surface and can be optically excited. One application is their use as novel barcode-like security labels on any object were authentication control is crucial (for example a banknote, a wearable tag, an identification card, a passport, packaging, a contact lens, a body part).

Figure 5:
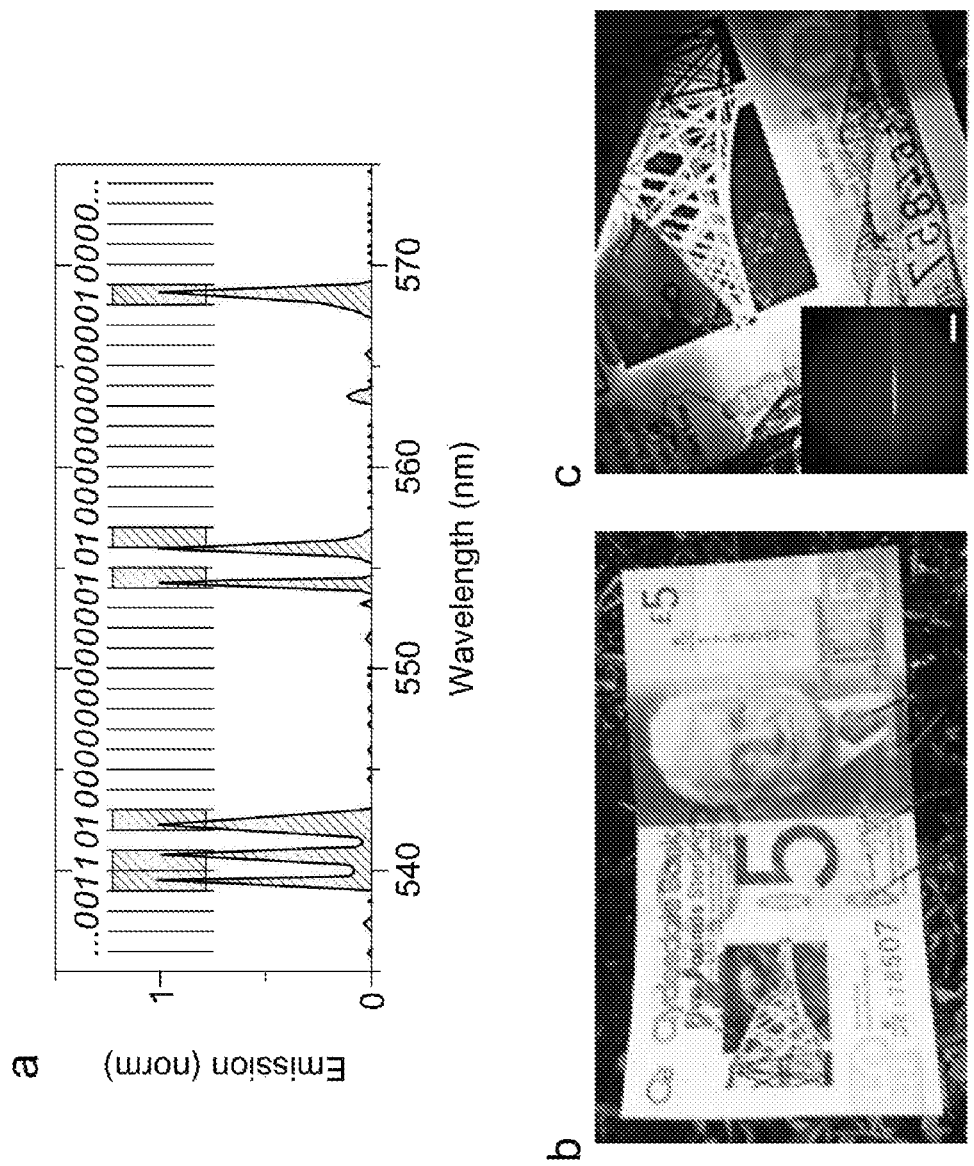
FIG. 5 shows a membrane laser implemented as a security feature on a banknote.
Figure 5:
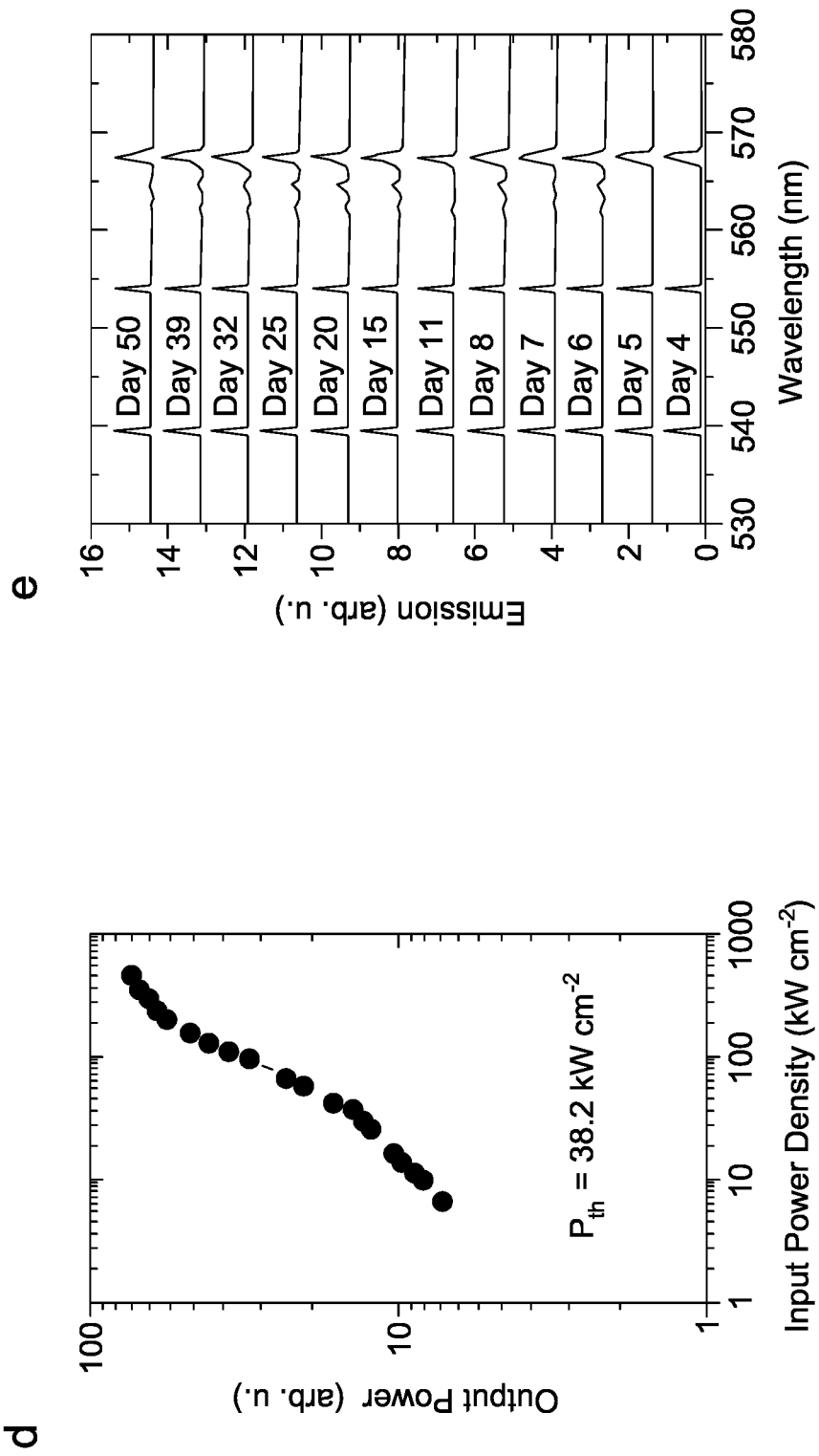

FIG. 5 shows membrane lasers used as security features on banknotes. As discussed above, the emission wavelength of the membrane laser can be modified through choice of gain material, grating design and waveguide design. The distinct single-wavelength emission signal can be used as an unambiguous identification. However, the security aspect of the membrane laser can be further enhanced by increasing the number of narrow laser emission peaks. This can be achieved by a forming a combination of different grating periods in the grating layer so that the membrane laser produces a laser light output having a plurality of wavelength peaks, the plurality of wavelengths acting as a signature.

FIG. 5(a) shows a barcode-like narrow-band lasing emission produced by a combination of different grating periods of the grating layer 14 of the membrane laser structure 10. The emissions range from 340-360 nm in second-order. In this context, second order refers to classification of the distributed feedback from the laser, in particular to the second-order diffraction from the grating that scatters the light propagating in a given direction in the waveguide into a mode in the counter-propagating direction.

One of the reasons an increasing number of countries are exchanging cotton banknotes for polymer notes is the improved counterfeit resilience offered by polymer banknotes. FIG. 5(b) is a photograph of a polymer banknote, in particular a £5 sterling banknote. These banknotes are produced with an optically transparent window. FIG. 5(b) shows a series of membrane laser structures transferred on to the optically transparent window of the banknote.

FIG. 5(c) is a macro photograph of an array of second-order DFB grating lasers (indicated by white squares) on the banknote. The inset plot shows the near field emission from a mixed-order grating on a banknote with a scale bar of 20 μm. The single DFB lasers can be identified by their reflection from a white light source, shown in FIG. 5(c). FIG. 5(d) shows input-output characteristics of a mixed-order DFB grating membrane laser on a banknote. Upon pulsed excitation, we can see laser action (the inset of FIG. 5(c) shows the near field emission from a mixed-order grating on a banknote) above a pump fluence of 38.2 kW cm$^{-2}$, see FIG. 5(d). The increased pump threshold is attributed to the change in wave-guiding properties. The polymer banknote acts as a substrate layer effectively reducing the mode confinement and introducing leaky substrate modes.

To validate their use as barcode-like labels, lasing emission from a membrane section with three different grating periods on a banknote was measured over several weeks. The banknote was stored under ambient conditions and no encapsulation was employed. FIG. 5(e) shows the lasing emission over a time span of 50 days. In some embodiments, the recorded wavelength at a maximum intensity shows a standard deviation <30 μm. The narrow spectral line width (<1 nm) and the broad gain spectrum (>50 nm) make it possible to have approximately $10^{15}$ unique labels using a single gain material.

Each label of the laser output can be described as similar to a binary barcode: a narrow spectral laser line (corresponding to "on" or numerically to a one) may be present at a wavelength or not present at the wavelength (corresponding to "off" or numerically to a zero).

The total number of possible unique labels can be calculated by taking $2^n$ where n is the number of possible "binary states/digits". A lower bound estimate is that a single spectral line width (width of one binary state) is about 1 nm and the gain spectrum (total space available for binary states) is 50 nm. Therefore, n=50 gives a total number of $2^{50}=1.1\times 10^{15}$ unique labels. Therefore, this can be encoded into a gain material that emits in a certain gain region of 50 nm.

In other embodiments, a second gain material with a gain spectrum of 50 nm in a different spectral range can be included together with the first gain material. This would provide n=100 and thus $2^{100}=1.27\times 10^{30}$ possible combinations.

In other embodiments, a third gain material with a gain spectrum of 50 nm in a different spectral range can be included together with the first gain material. This would provide n=150 and thus $2^{150}=1\times 10^{45}$ possible combinations.

In other embodiments, polarization state of the output light may be used in addition or alternatively to wavelength as another dimension for encoding information. The polarization of the output light may be controlled by altering the orientation of the grating layer or the gain layer.

Figure 6:
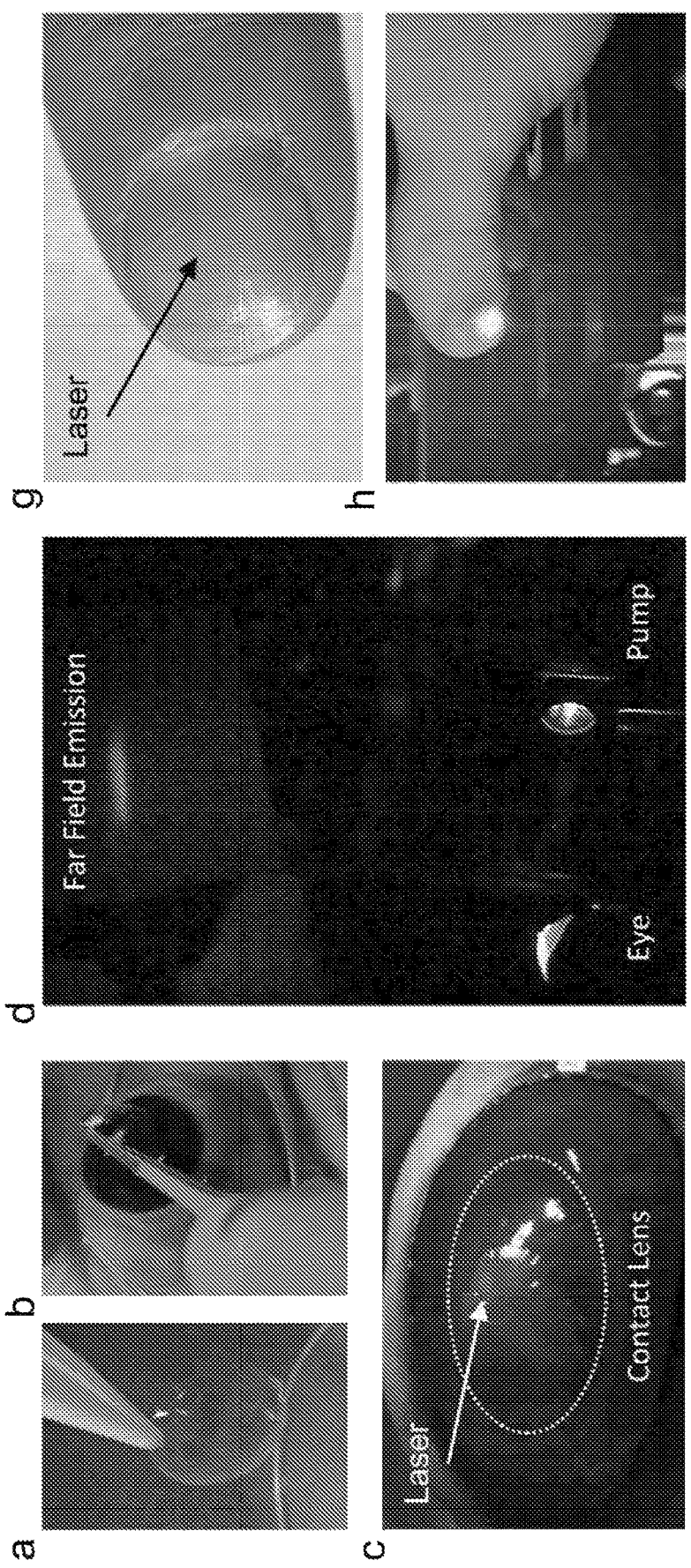
FIG. 6 shows membrane lasers implemented as a wearable security tag.
Figure 6:
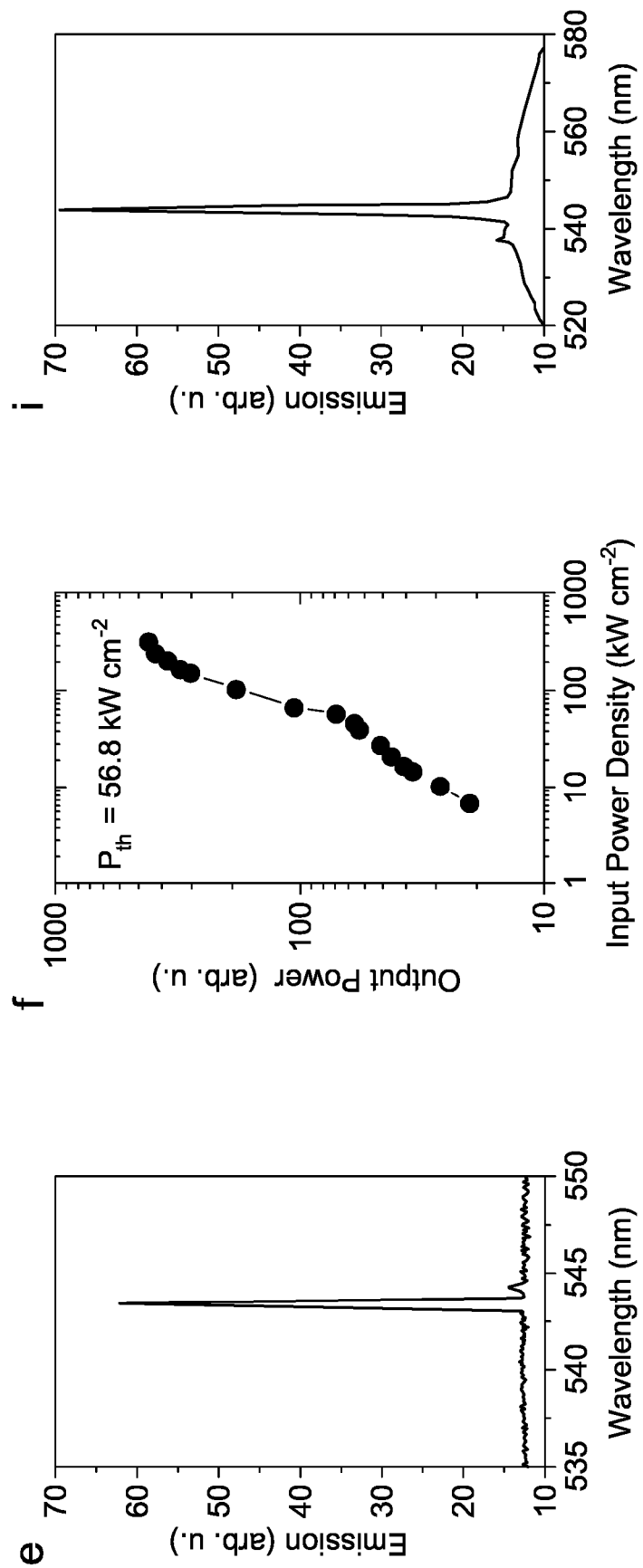

FIG. 6 shows membrane lasers used as a wearable security tag. The high optical transparency of the membrane lasers (illustrated above in FIG. 3(g)), combined with their low thresholds (illustrated in FIG. 4(a)) and ultra-thin design permits their use as wearable security tags. The security tags can be used on contact lenses where they can complement biometric authentication via iris scan.

Post lift-off, the membrane laser was transferred onto commercially available contact lenses as shown in FIG. 6(a). The contact lens with membrane laser was transplanted onto bovine eyes, as shown in FIG. 6(b). Although, the bovine eyeballs serve as an excellent model of human eyes due to their similar structure, slightly larger size and general availability.

FIG. 6(c) shows the reflection from a white light source of a second-order DFB laser (bright green square) on the contact lens transplanted onto a bovine eye. FIG. 6(d) shows a far field laser emission of the same membrane laser when optically pumped. Upon optical excitation with pulsed blue light (λ=450 nm) a well-defined green laser beam was observed. The narrow width of the far field pattern shown in FIG. 6(d) confirms that the lasing emission from the eye ball is generated with a second-order DFB laser (as also illustrated previously in FIG. 4(c)). FIG. 6(e) shows an emission spectrum measured from a laser on a bovine eye ball. The emission was measured using a spectrometer and shows a narrow lasing emission peak at λ=543.4 nm.

FIG. 6(f) shows input-output characteristics of a mixed-order DFB laser on a bovine eye ball. To the right hand side of the plot is a red shaded area that indicates the onset of pump power density exceeding the ocular safety limit for humans. The lasing action is confirmed by the super-linear relation between input power density and output power, shown in FIG. 6(f).

The pump power density to achieve lasing for the membrane laser on the contact lens is at 56.8 kW cm$^{-2}$. This value is higher compared to the free-standing membrane laser which can be attributed to the contact lens acting as a substrate and hence weakening the mode confinement.

The maximum permissible exposure for ocular safety (ANSI 2000) to validate the use of the lasers on human eyes was calculated. For a divergent pump beam with a full visual angle $\alpha=50°$, a wavelength $\lambda=450$ nm, a repetition rate of 5 Hz and a single pulse duration of 5 ns the maximum permissible corneal irradiance (thermal limit) is 505.1 kW cm$^{-2}$ and therefore almost one order of magnitude above the required pump power density for our laser, as shown in the red shaded area of FIG. 6(f). To ensure safe operation, in particular for eye safety, a suitable selection of laser and/or laser parameters and appropriate laser safety procedure and precautions are required.

To further show the excellent transferability and bio-integration of the membrane laser, the membrane laser was transferred to onto a fingernail, shown in FIG. 6(g). FIG. 6(h) shows optical excitation of the membrane laser on a fingernail. The spectrum is measured using a spectrometer and may be used to augment biometric finger print scanning. FIG. 6(i) shows an emission spectrum recorded using a spectrometer. The membrane laser structure adhered to the fingernail can complement biometric authentication via fingerprint scan.

The manufacture of the membrane laser 10 and membrane laser stack 20 is now described. A sacrificial layer 22 comprising PEDOT:PSS (Sigma Aldrich) having a thickness approximately 50 nm was spin coated on an oxygen plasma treated glass substrate (25 mm×25 mm) at 4000 rpm for 60 seconds and then baked for 10 min at 100° C.

Subsequently, a thin (less than 10 nm) adhesion promoter (mr-APS1, Micro Resist Technology) and the photo-curable nanoimprint lithography resist (mr-UVCur21-200 nm, Micro Resist Technology) were spin coated and baked according to the guidelines of the manufacturer.

In a next step, a transparent and soft stamp compromising a negative of the final grating structure was moulded into the UV curable polymer layer and the stack was then exposed to UV light ($\lambda=365$ nm) at a constant dose (56 mW cm$^{-2}$) for 220 s (EVG620). In the present example, the final grating structure is a mixed-order and second-order grating with nominal grating periods of 340 nm, 350 nm and 360 nm in second-order. While a UV curable polymer layer is described the grating layer may be formed from a photo-resist. A UV nanoimprint lithography process is used, but other techniques may be used For example, nano-imprint techniques are used to pattern gratings into polymer lasers, using either heat or solvents to soften and/or swell a polymer layer before pressing the patterned stamp into the film. Gratings in a grating layer may be patterned in a transparent cladding layer or may be directly patterned in the gain material.

Figure 7:
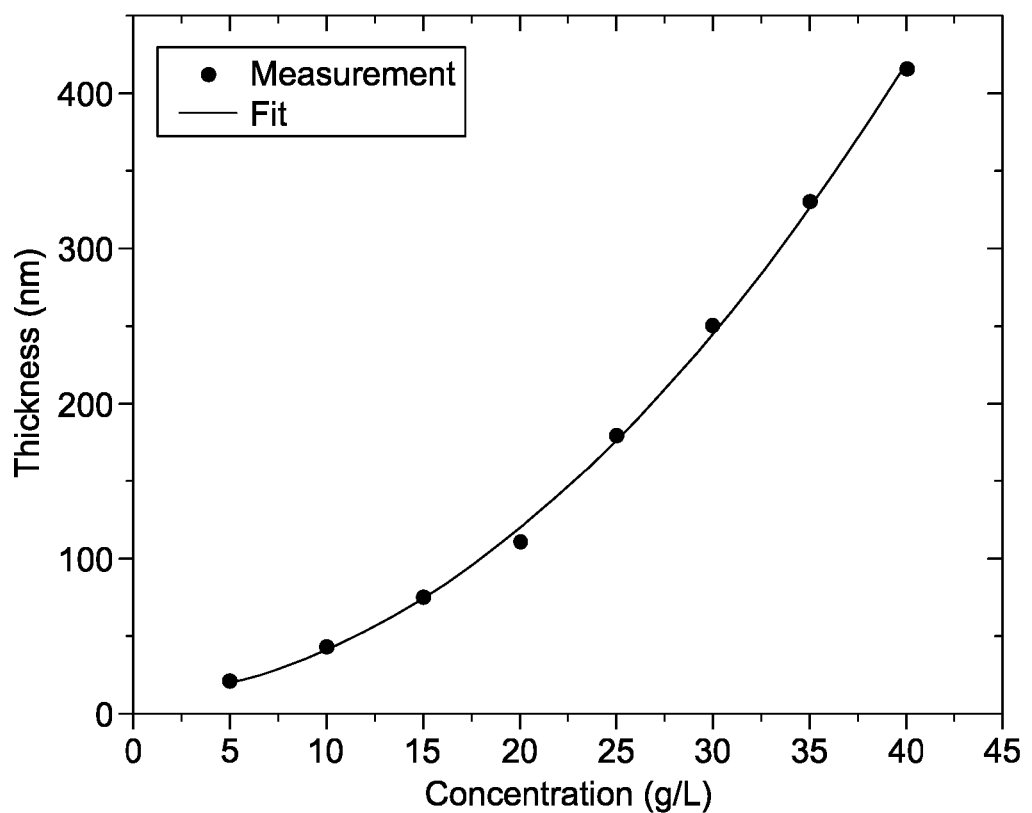
FIG. 7 is a plot illustrating thickness of layer against concentration.

After removing the soft stamp, the grating surface (residual layer 50 nm) was treated with an oxygen plasma to clean it from remaining organic residues and reduce the hydrophobicity. In a next step, the gain material was spin coated at 2000 rpm for 60 s leaving the gain layer 22 of (180±10) nm. Different gain materials were used. A first example is F8$_{0.9}$BT$_{0.1}$ (poly(9,9-dioctylfluorene-co-benzothiadiazole) with 9:1 ratio of F8- and BT units) dissolved in Toluene at a concentration of 25 mg ml$^{-1}$, ADS233YE, American Dye Source Inc. A second example is F8BT (poly(9,9-dioctylfluorene-co-benzothiadiazole)) dissolved in Toluene at a concentration of 25 mg ml$^{-1}$, ADS133YE, American Dye Source Inc. A third example is Super Yellow dissolved in Toluene at a concentration of 10 mg ml$^{-1}$, PDY-132, Merck. FIG. 7 is a plot illustrating thickness layer against concentration.

To release the membrane from the rigid glass substrate, the laser stack was immersed into a deionized water bath at 55° C. for 1 h. The increased temperature facilitated and accelerated the dissolution of the PEDOT:PSS sacrificial layer 22.

The thickness of the single layers were measured using a profilometer (DEKTAK), as described with reference to FIG. 3(g). The DFB grating properties were measured using an atomic force microscope (AFM) and are shown in FIG. 8.

Figure 8:
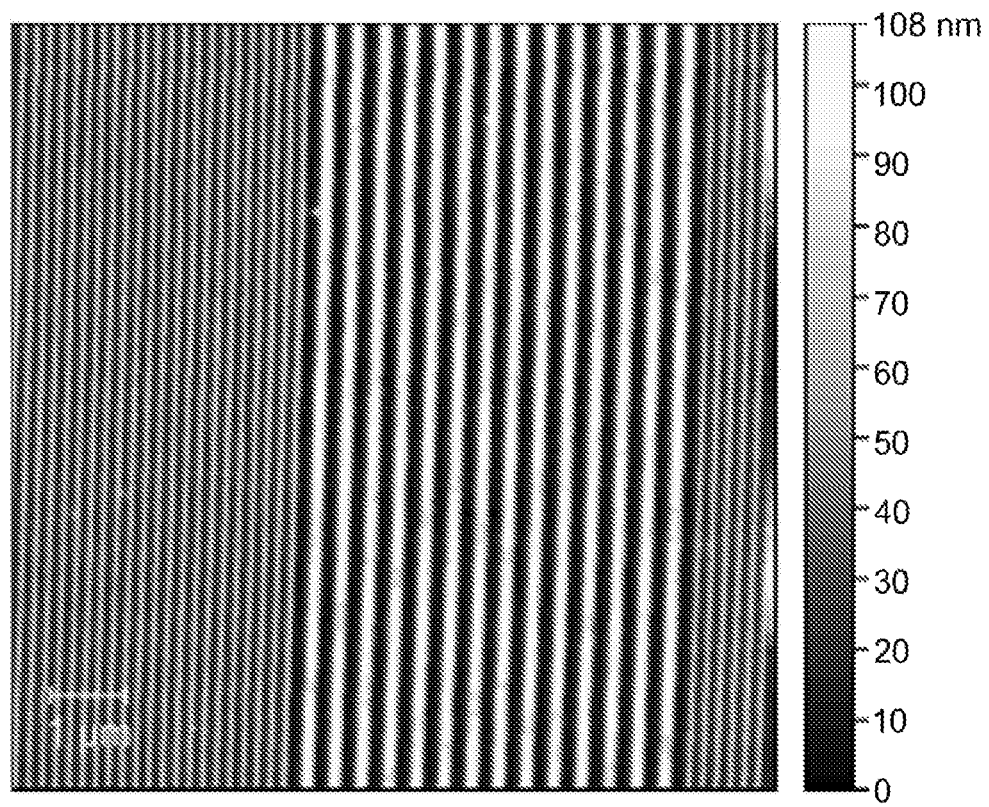
FIG. 8 shows groove depth of grating structures.

FIG. 8 shows a mixed order DFB grating. A first grating area has a groove depth of (85±4) nm in first-order periods for in-plane feedback. A second grating has grating has a groove depth of (106±5) nm in second-order periods for outcoupling perpendicular to the layer. The single DFB gratings have an area of 1 mm$^2$. A mixed order grating structure may achieve low pump thresholds.

Whilst the process above relates to manufacture of a single membrane laser, it is possible to manufacture many membrane lasers at the same time. Considering the use of cost-effective materials and the recent developments in the field of roll-to-roll nanoimprint lithography and organic ink jet printing, specialized facilities may soon fabricate the membrane lasers on a large scale, with high reproducibility at low cost.

A sheet of membrane laser structure may be constructed as described above and then separated, by cutting or other methods, into a plurality of individual membrane lasers.

Before or after attachment of the membrane laser structure to a further object, a protective layer may be applied to the upper surface of the membrane laser structure.

The protective layer is preferably optically transparent. The protective layer typically has a lower refractive index than the light emission layer to provide improved wave-guiding properties. A first example is a layer of CYTOP, a commercial fluorinated polymer. CYTOP is a good water barrier. Other possible materials include different polymers, such as an epoxy, or a sol-gel or other solution-processed glass, or the protective layer could be an evaporated or sputtered thin film.

The membrane lasers were optically investigated on a custom-build inverted fluorescence microscope. The emission from an optical parametric oscillator (OPO, Opolette 355, Opotek Inc.) was tuned to 450 nm (repetition rate, 5 Hz; pulse durations, 5 ns), passed through a dichroic beam splitter (cut-on wavelength of 500 nm) and focused onto the membrane lasers with a 40×/10× objective. The longer wavelength emission was collected with the same objective and passed into the collection path via the dichroic beam splitter. For bright field images, the light was focused onto a CCD camera using a projection lens and a flip mirror. To record the spectrally resolved laser emission the light was focused onto the entrance slid of a spectrometer (Andor, Shamrock 500i) and recorded with an attached EM-CCD camera (Andor, Newton 971). The pump spot size was varied from 35-400 μm diameter.

For far field emission measurements, the back focal plane of the objective was imaged onto the entrance slid of the spectrometer by inserting an additional lens in the emission path at a distance one focal length away from the back focal plane of the objective and one focal length away from the projection lens in front of the spectrometer. The image was passed through the spectrometer without wavelength separation and recorded with the attached EM-CCD camera.

To control the pump power density of single pulses and record the input-output characteristics of the membrane lasers, the OPO emission was passed through a pair of birefringent polarizers with the angle between the OPO emission polarization and the first polarizer adjusted by a computer controlled variable stepper motor. Emission spectra at different pump power densities were recorded with the EM-CCD camera and spectrally integrated to determine the laser output power The membrane lasers are organic, ultra-thin and substrate-free and offer the advantages of extreme mechanical flexibility and light-weight construction. These physical properties together with the tunable and unique output spectra ($10^{15}$ per gain material) renders the membrane lasers a well-suited security feature on any substrate where authentication control is crucial.

Various applications of the membrane laser structure are provided in various embodiments. One application includes labeling the packaging of consumables, for example, whiskey bottles. In this application, the membrane lasers do not only help for counterfeit prevention in an economical context but also reduce the potential risk of health issues for the end-consumer arising from poor quality and toxic ingredients within counterfeited spirits.

Other than exploiting the security feature aspect, one can think of using the membrane lasers as sensors for vapour sensing. The thin film technology together with the access to the fluorescent emitter from both sides may increase the sensitivity of conventional fluorescent sensors. It is known, that organic lasers can be used as versatile chemo-sensors that can detect minute changes in their chemical environment. The underlying process is the interaction between compounds in a sensing region about the sensor, for example, nitro-aromatic compounds like the explosives DNT or TNT, and light emitting conjugated polymer of the laser which leads to quenching of excitons and hence a reduction of a fluorescence signal. This process is observable already in neat films of organic materials.

This process is further enhanced in organic lasers wherein the non-radiative decay pathways (quenching) induced by the presence of trace vapours of explosives changes the lasing threshold and so cause large changes in the output of lasers operating close to threshold.

Known thin film fluorescent emitters of chemo-sensors (with or without a resonator and hence a laser) are accessible only from one side and hence fluorescence quenching is induced only from one side (the other side is not accessible due to the presence of the substrate). One sided chemo-sensors are described in: Rose, Aimee, et al. "Sensitivity gains in chemo-sensing by lasing action in organic polymers." Nature 434.7035 (2005): 876-879 and Wang, Yue, et al. "LED pumped polymer laser sensor for explosives." Laser & photonics reviews 7.6 (2013).

Figure 9:
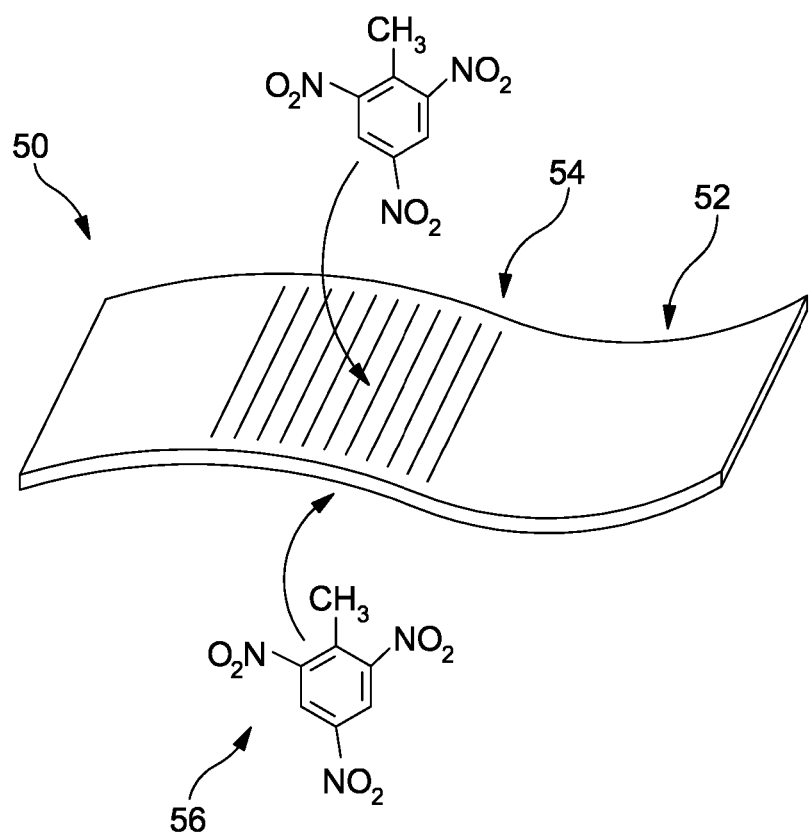
FIG. 9 is a perspective view of a sensor comprising a membrane laser structure.

According to further embodiments, and as shown in FIG. 9, a sensor 50 comprising a membrane laser structure for performing a sensing process for sensing at least one substance in at least one sensing region is provided. An input to provide the at least one substance to the sensor, in particular to permit the at least one substance to contact the sensor, may be provided. The sensor comprises at least two opposed sensing surfaces arranged such that each of which is exposed to the sensing region.

The sensor 50 comprises a membrane laser structure. The sensor 50 has a flexible emission layer 52 comprising a gain material; and one or more structures 54 formed in or associated with the flexible emission layer 52 and configured to provide optical feedback in the emission layer to produce a laser light output. The structures are gratings formed on the surface of the emission layer 52 and act as resonator structures. Suitable detection circuitry (not shown) is provided. An optical pump source (not shown) is also provided.

FIG. 9 shows a substance 56 to be sensed by the sensor 50, in this example the substance 56 is TNT. The substance interacts with the material of the flexible emission layer 52 on both sides of the flexible emission layer 52.

The gain material may be a light emitting conjugated polymer including fluorescent organic materials. Suitable gain materials include gain materials described above, including $F8_{0.9}BT_{0.1}$; F8BT; and Super Yellow The sensor 50 may be arranged to expose both sensing surfaces. For example, the sensor 50 may be free-standing or suspended.

In operation, a substance 56 can interact with the emission layer of the sensor 50 at both sensing surfaces of the sensor 50. An optical pump source (not shown in FIG. 9) provides light to the laser membrane and the laser membrane produces a laser output. Due to the interaction between the substance 56 and the gain material of the sensor 50, one or more properties of the laser output of the laser membrane is altered in the presence of the substance.

For example, output emission intensity of the laser output may be enhanced in the presence of substance. The change of one or more properties of the laser output may be due to lasing threshold of the laser operating close to threshold changes due to the non-radiative decay pathways (quenching) induced by the presence of the substance. Detection circuitry (not shown in FIG. 9) detects the altered optical signal from the laser membrane and converts the optical signal into an electronic sensor signal representative of the sensed substance. The presence and/or amount of the substance may be determined from the sensor signal. Any suitable detection circuitry may be used, for example any suitable detection circuitry for detecting and processing laser or other optical signals.

The sensor 50 comprising a membrane laser structure permits interaction between the chemical environment and the fluorescent probe from both sides and may increase the sensitivity and reduce the response time of the sensor 50. By permitting interaction between the chemical environment and the fluorescent probe from both sides the sensitivity may be increase and the response time may be decreased for both fluorescent sensors based on lasing emission (in the case with a resonator) as well as sensors based on pure photo luminescence (in the case without a resonator).

The at least one substance comprises a chemical vapour, for example, DNT, TNT, traces of amines, oxygen. The gain material may be selected based on the chemical vapour to be sensed.

A skilled person will appreciate that variations of the enclosed arrangement are possible without departing from the invention. For example, other light sources could be used as an optical pump source, for example, conventional light emitting diodes. In a further example, whilst periodic structures are discussed, aperiodic structures may be arranged to provide optical feedback. Accordingly, the above description of the specific embodiment is made by way of example only and not for the purposes of limitations. It will be clear to the skilled person that minor modifications may be made without significant changes to the operation described.

The invention claimed is:

1. A security or identification device comprising a membrane laser structure configured to be optically pumped, the membrane laser structure comprising:

a flexible emission layer comprising a gain material; and
one or more structures formed in or associated with the flexible emission layer and configured to provide optical feedback in the emission layer to produce a laser light output having at least one property representing an identifier, Wherein the at least one property comprises a plurality of wavelengths and wherein the one or more structures comprise at least one periodic structure having a plurality of different periods such that said produced laser light output has said plurality of wavelengths.

2. A device according to claim 1, wherein the one or more structures of the emission layer are at least one of contiguous, overlapping or side-by-side.

3. A device according to claim 1, wherein the at least one property comprises one or more wavelengths in a selected wavelength range, for example between about 380 and 900 nm.

4. A device according to claim 1, wherein the identifier is representative of the identity of the security device or at least one property of the security device, or the identity or at least one property of an object to which the security device is attached or to be attached, or the identity or at least one property of an owner, user, manufacturer or retailer of the device or object, or the identity or at least one property of content stored by the object or contained in the object.

5. A device according to claim 1, wherein the security device is attached to a banknote or is configured to be attached to a banknote, and the identifier is representative of or associated with at least one of the manufacturer of the banknote or a serial number of the banknote.

6. A device according to claim 1, wherein the security device is attached to an object or is configured to be attached to an object,
and the object comprises at least one of: a wearable tag, an identification card, a passport, packaging, a contact lens, a body part, a medicament or a medicament container, a pharmaceutical product, a storage device, a video, audio or computer program storage device, a watch, an item of jewelry, a food or drink container, an electronic device or component, an optical device or component.

7. A device according to claim 1, wherein the at least one property is representative of or associated with at least one biometric property.

8. A device according to claim 1, wherein the membrane laser structure comprises a distributed feedback laser (DFB) structure.

9. A device according to claim 1, wherein the gain material has a thickness of at least 10 nm.

10. A device according to 1, wherein the one or more structures comprises one or more gratings comprising a groove depth of 30 to 120 nm.

11. A device according to claim 1, wherein the membrane laser comprises a length in the range 10 μm to 25 mm and a width in the range 10 μm to 25 mm.

12. A device according to claim 1, wherein the emission layer comprises one or more further gain materials.

13. A device according to claim 1, wherein the gain layer comprises a polymer.

14. A device according to claim 13, wherein the polymer comprises one of: F80.9BT0.1; F8BT; and Super Yellow.

15. A device according to claim 1, wherein the one or more structures are formed from a photo-resist.

16. A method of determining an identifier comprising applying light to a device according to claim 1 to produce a laser light output having at least one property representing the identifier and determining the identifier from the laser light output.

17. A method of marking or identifying a device comprising:
obtaining a membrane laser structure configured to be optically pumped, the membrane laser structure comprising:
a flexible emission layer comprising a gain material; and one or more scattering structures formed in or associated with the flexible emission layer and configured to provide optical feedback in the emission layer to produce a laser light output having at least one property, wherein the at least one property comprises a plurality of wavelengths and wherein the one or more structures comprise at least one periodic structure having a plurality of different periods such that said produced laser light output has said plurality of wavelengths; and
attaching the membrane laser structure to an object.

18. A method according to claim 17, wherein attaching the membrane laser structure comprises attaching the membrane laser structure to the object following production of the object.

19. A method according to claim 17, further comprising applying a protective layer on the membrane laser structure.

20. A method of forming at least one membrane laser structure comprising:
forming a sacrificial layer on a substrate;
providing at least one membrane laser structure on the sacrificial layer, wherein the membrane laser structure comprises a flexible emission layer;
forming one or more structures in or associated with the flexible emission layer;
dissolving and/or detaching the sacrificial layer thereby separating the membrane laser structure from the substrate.

21. A method according to claim 20 wherein the sacrificial layer is water soluble.

22. A method according to claim 21, wherein the sacrificial layer comprises at least one of:
PEDOT, PEDOT:PSS, polyethylene glycol, polyacrylamide, poly(acrylic acid), Dextran, poly(methacrylic acid), polyethylene imine).

23. A method according to claim 20, comprising printing the structures.

24. A method according to claim 23, wherein the printing comprises using a UV nanoimprint lithography process.

25. A method according to claim 20, further comprising separating the membrane laser structure into a plurality of separate membrane laser structures.

26. A sensor comprising a membrane laser structure for performing a sensing process for sensing at least one substance in at least one sensing region, wherein the membrane laser structure comprises at least two opposed sensing surfaces arranged such that each of which is exposed to said at least one sensing region.

27. A sensor according to claim 26, comprising a flexible emission layer comprising a gain material; and one or more structures formed in or associated with the flexible emission layer and configured to provide optical feedback in the emission layer to produce a laser light output representative of the at least one sensed substance.

28. A sensor according to claim 27, further comprising a light emitting conjugated polymer.

29. A sensor according to claim 26, wherein the at least one of the at least two opposed sensing surfaces is in contact with the at least one sensing region.

30. A sensor according to claim 26, wherein the at least one sensing region comprises part of a surrounding environment.

31. A sensor according to claim 26, wherein the at least one substance comprises a chemical vapour.

* * * * *